(12) United States Patent
McCarthy et al.

(10) Patent No.: US 11,841,221 B2
(45) Date of Patent: *Dec. 12, 2023

(54) MOBILE DEVICE AND METHOD FOR SENSOR DATA BASED ANTENNA SELECTION

(71) Applicant: Futurewei Technologies, Inc., Plano, TX (US)

(72) Inventors: Robert McCarthy, Escondido, CA (US); Ping Shi, San Diego, CA (US); Navid Nader, San Diego, CA (US); Vinh Vo, Plano, TX (US); Vijayakumar Krishnamurthy, San Marcos, CA (US)

(73) Assignee: Futurewei Technologies, Inc., Plano, TX (US)

( * ) Notice: Subject to any disclaimer, the term of this patent is extended or adjusted under 35 U.S.C. 154(b) by 361 days.

This patent is subject to a terminal disclaimer.

(21) Appl. No.: 17/139,725

(22) Filed: Dec. 31, 2020

(65) Prior Publication Data

US 2021/0199414 A1 Jul. 1, 2021

Related U.S. Application Data

(63) Continuation of application No. 15/983,808, filed on May 18, 2018, now Pat. No. 10,883,811, which is a
(Continued)

(51) Int. Cl.
*G01B 5/24* (2006.01)
*H03K 17/955* (2006.01)
(Continued)

(52) U.S. Cl.
CPC .............. *G01B 5/24* (2013.01); *G06F 1/1626* (2013.01); *G06F 1/1694* (2013.01); *G06F 3/01* (2013.01);
(Continued)

(58) Field of Classification Search
CPC ....... G01B 5/24; G06F 1/1626; G06F 1/1694; G06F 3/01; H03K 17/941; H03K 17/955;
(Continued)

(56) References Cited

U.S. PATENT DOCUMENTS 9,976,841 B2 5/2018 McCarthy et al.
2011/0312349 A1* 12/2011 Forutanpour ......... G06F 1/1626
455/566

(Continued)

*Primary Examiner* — Andrew Schechter
*Assistant Examiner* — Jeremy A Delozier
(74) *Attorney, Agent, or Firm* — Slater Matsil, LLP

(57) ABSTRACT

A mobile device for determining a handling condition of the mobile device and a method of use thereof. One embodiment of the mobile device includes: at least one left capacitive proximity sensor disposed on a left side of the mobile device and operable to detect a hold condition, at least one right capacitive proximity sensor disposed on a right side of the mobile device and operable to detect a hold condition, an accelerometer disposed in the mobile device and operable to detect an orientation of the mobile device, an ambient light proximity sensor disposed in the mobile device and operable to detect a proximity of a user's head, and a processor operable to execute an application configured to gain access to and employ the hold condition, the orientation, and the proximity of the user's head to determine a handling condition.

19 Claims, 7 Drawing Sheets

Related U.S. Application Data continuation of application No. 14/143,957, filed on Dec. 30, 2013, now Pat. No. 9,976,841.

(51) Int. Cl.
| | | |
|---|---|---|
| *H03K 17/94* | (2006.01) | |
| *H03K 17/96* | (2006.01) | |
| *G06F 1/16* | (2006.01) | |
| *H04M 1/72454* | (2021.01) | |
| *G06F 3/01* | (2006.01) | |
| *H04M 1/00* | (2006.01) | |

(52) U.S. Cl.
CPC ......... *H03K 17/941* (2013.01); *H03K 17/955* (2013.01); *H03K 17/9622* (2013.01); *H04M 1/00* (2013.01); *H04M 1/72454* (2021.01); *H03K 2217/94106* (2013.01)

(58) Field of Classification Search
CPC . H03K 17/9622; H04M 1/00; H04M 1/72454
See application file for complete search history.

(56) References Cited

U.S. PATENT DOCUMENTS

| | | |
|---|---|---|
| 2013/0005310 A1 | 1/2013 | Lim et al. |
| 2013/0093680 A1 | 4/2013 | Ogita |
| 2013/0273870 A1* | 10/2013 | Shi .................. H01Q 21/245 |
| | | 343/894 |
| 2014/0066124 A1 | 3/2014 | Novet |
| 2015/0185265 A1 | 7/2015 | McCarthy et al. |

* cited by examiner

MOBILE DEVICE AND METHOD FOR SENSOR DATA BASED ANTENNA SELECTION

CROSS-REFERENCE TO RELATED APPLICATIONS

This application is a continuation of U.S. application Ser. No. 15/983,808, (Now U.S. Pat. No. 10,883,811 issued on Jan. 5, 2021), filed on May 18, 2018 which is a continuation of U.S. application Ser. No. 14/143,957, (Now U.S. Pat. No. 9,976,841 issued on May 22, 2021), filed on Dec. 30, 2013, which applications of which are incorporated herein by reference.

TECHNICAL FIELD

This invention relates generally to a mobile device and method and, more specifically, to a mobile device and method for determining a handling condition of the mobile device.

BACKGROUND

Mobile devices have become some of the more ubiquitous items in the modern world. Developments in computing and battery technology have allowed mobile device manufacturers and service providers to expand traditional roles of mobile devices to incorporate functions and modes of operation once resigned to desktop computers, game consoles, and entertainment systems. Mobile devices include cellular phones, smart phones, tablet computers, handheld gaming systems, and other mobile computing systems.

SUMMARY

An embodiment mobile device for determining a handling condition includes: at least one left capacitive proximity sensor disposed on a left side of the mobile device and operable to detect a hold condition, at least one right capacitive proximity sensor disposed on a right side of the mobile device and operable to detect a hold condition, an accelerometer disposed in the mobile device and operable to detect an orientation of the mobile device, an ambient light proximity sensor disposed in the mobile device and operable to detect a proximity of a user's head, and a processor operable to execute an application configured to gain access to and employ the hold condition, the orientation, and the proximity of the user's head to determine a handling condition.

An embodiment method of determining a handling condition of a mobile device includes: determining a hold condition according to left and right capacitive proximity sensors, detecting a proximity to a user's head, detecting an orientation of the mobile device, and determining the handling condition according to the hold condition, the proximity, and the orientation.

An embodiment method for selecting an antenna on a mobile device, includes: determining a hold condition according to left and right capacitive proximity sensors, detecting a proximity to a user's head, detecting an orientation of the mobile device, determining a handling condition according to the hold condition, the proximity, and the orientation, and selecting one antenna from a plurality of antennas according to the handling condition.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present disclosure and the advantages thereof, reference is now made to the following descriptions taken in conjunction with the accompanying drawings, in which.

Figure 1:
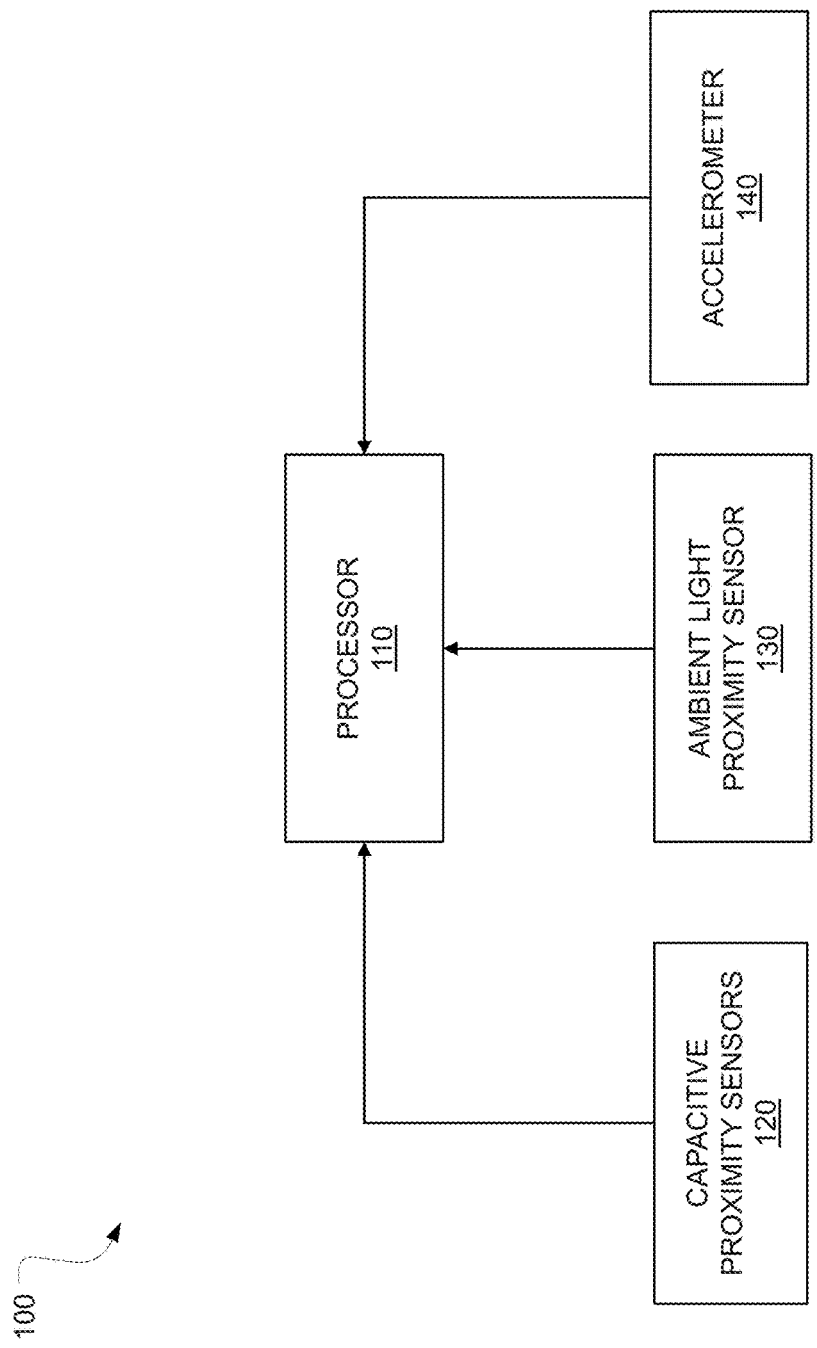
FIG. 1 is a block diagram of one embodiment of a sensor system.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Given the growing popularity and variety of functions of mobile devices, it is realized herein there exists a need to determine a handling condition at a given moment. The handling condition of a mobile device describes how the mobile device is physically situated and, in certain cases, how it is being used. For example, the handling condition describes whether the mobile device is held in the left hand or the right hand of a user, and in certain embodiments, whether the mobile device is being held at all. The handling condition can also describe whether the mobile device is being held beside the user's head or away from the body. It is also realized herein, in certain embodiments, the handling condition can also contemplate the mobile device being held by both hands and in what orientation.

It is further realized herein the handling condition of the mobile device can impact its performance in certain regards. For example, the handling condition can impact the performance of one or more antennas of the mobile device, necessitating an adjustment of antenna power and, consequently, impacting further performance of other mobile device subsystems. Being held in the user's hand or near the user's head can obscure the various antennas. Antenna obscuration may give rise to a need to increase antenna power, or signal power, to maintain communication over its respective channels. Any degradation over the respective channels can impact performance of the mobile device or, more specifically, applications and programs that rely on communication over the respective channels. The occurrence and amount of obscuration varies with the handling condition for each antenna on the mobile device. Many mobile devices utilize multiple antennas for various purposes, including cellular communication, Wi-Fi, Bluetooth, and others. The multiple antennas may also include redundant antennas for reliability. It is also realized herein knowledge of the mobile device's handling condition can be used to select a course of action. In the example mentioned above, an antenna can be selected for use in wireless communication according to the mobile device's current handling condition. In other embodiments, the handling condition can be used to configure antenna settings, such as power levels or mode selection. In alternative embodiments, the current handling condition can be used to configure display settings, including brightness, resolution, and frame rates, among others.

FIG. 1 is a block diagram of one embodiment of a sensor system 100. Sensor system 100 includes a processor 1o communicably coupled to capacitive proximity sensors 120, an ambient light proximity sensor 130, and an accelerometer 140. Processor 11o can be communicably coupled via any electronic communication medium, including a data bus, a serial data link, or other electric circuit, such as wiring or traces on a printed circuit board (PCB).

Capacitive proximity sensors 120 utilize capacitive sensing to detect anything conductive or having dielectric properties different from air. Capacitive proximity sensors 120 are opposingly couplable to a mobile device, which is to be located on opposite sides of the mobile device. For example, in certain embodiments, capacitive proximity sensors 120 are located on the left and right sides of the mobile device. Capacitive proximity sensors 120 detect present capacitance on the opposing sides of the mobile device. The present capacitance is indicative of a particular hold condition. A hold condition describes whether and how the mobile device is being held. For example, in certain embodiments, the hold condition describes whether the mobile device is held in a left hand, a right hand, or not held at all. The mobile device being held in the left hand is sometimes referred to as a left-hand hold. Likewise, the mobile device being held in the right hand is sometimes referred to as a right-hand hold. When the mobile device is not held at all, it is considered to be in free space. In alternative embodiments, the hold condition can also describe the mobile device being held in both hands, which is sometimes referred to as a two-hand hold. As the mobile device is held in one hand, capacitive proximity sensors 120 detect the capacitance of the palm, thumb, and fingers on the opposing sides of the mobile device. The palm and thumb of the hand create a capacitance with capacitive proximity sensors 120 that is distinguishable from that created by the fingers. The capacitance created by any of the palm, thumb, and fingers is further distinguishable from that of air. Expected capacitances of the palm, thumb, fingers, and air can be measured and employed as a basis for comparison to capacitances present at capacitive proximity sensors 120. The hold condition is an element of the handling condition.

Ambient light proximity sensor 130 is couplable to the mobile device, typically on the face of the mobile device that would be nearest a user's head when in use and held beside the user's head. Ambient light proximity sensor 130 is operable to detect the proximity of a user's head to the mobile device. As the mobile device is held nearer to the user's head, the amount of ambient light sensed by ambient light proximity sensor 130 is reduced relative to normal, open air illumination. The proximity of the user's head to the mobile device is also an element of the handling condition.

Accelerometer 140 is also couplable to the mobile device and is configured to detect acceleration of the mobile device in at least one dimension. Orientation of the mobile device can be measured according to the detected acceleration. The orientation is also an element of the handling condition of the mobile device.

Processor 110 is configured to gain access to the hold condition determined by capacitive proximity sensor 120, the proximity determined by ambient light proximity sensor 130, and the orientation determined by accelerometer 140. Processor 110 is further configured to use the hold condition, proximity, and orientation to determine the handling condition of the mobile device. In certain embodiments, the orientation determined by accelerometer 140 can be used to confirm the hold condition determined by capacitive proximity sensors 120. When the mobile device is held beside the user's head, it is typically tilted in one direction or the other depending on which side of the user's head the mobile device is held. The tilting is generally rolled in the plane of the display. For example, when ambient light proximity sensor 130 determines the mobile device is held beside the user's head, processor 110 is operable to use the angle of tilt to determine which side of the user's head the mobile device is beside, thereby confirming or contradicting the hold condition determined by capacitive proximity sensors 120. In certain embodiments, the orientation of the mobile device when beside the right side of the user's head is indicative of the mobile device being held by the right hand. Likewise, the orientation of the mobile device when beside the left side of the user's head is indicative of the mobile device being held by the left hand. When ambient light proximity sensor 130 determines the mobile device is not beside the user's head, or away from the user's body, the hold condition as determined by capacitive proximity sensors 120 is indicative of the mobile device being held in a right hand, a left hand, no hands, or both hands.

Figure 2:
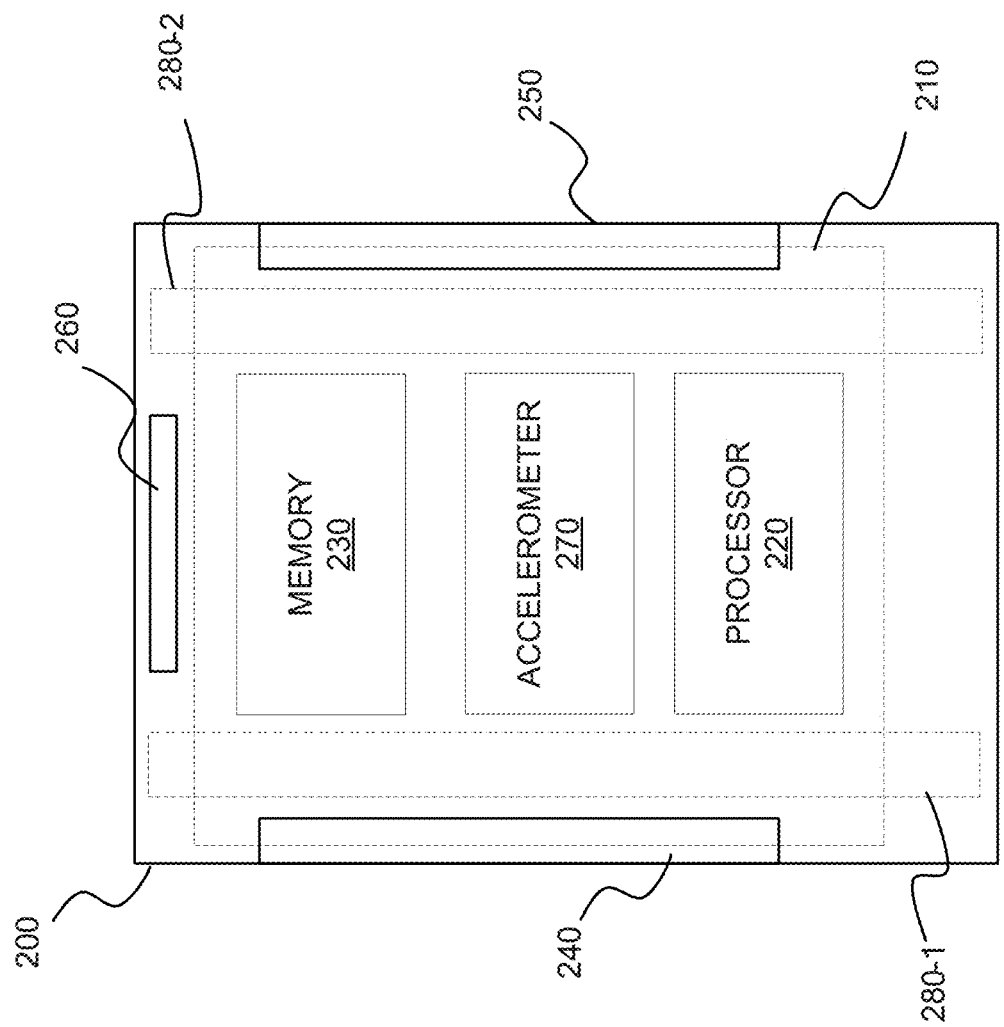
FIG. 2 is a block diagram of one embodiment of a mobile device.

FIG. 2 is a block diagram of one embodiment of a mobile device 200. Mobile device 200 includes a display 210, a processor 220, and a memory 230. Processor 220 is configured to gain access to and execute programs stored in memory 230. Mobile device 200 also includes an ambient light proximity sensor 260, an accelerometer 270, at least one left capacitive proximity sensor 240, and at least one right capacitive proximity sensor 250.

Left capacitive proximity sensor 240 and right capacitive proximity sensor 250 are opposingly coupled to the left and right sides, respectively, of mobile device 200, and are configured to detect a hold condition of mobile device 200. In certain embodiments, left capacitive proximity sensor 240 is a single capacitive proximity sensor operable to detect a capacitance created by a left or right hand. The same is true for right capacitive proximity sensor 250. In other embodiments, mobile device 200 can include a plurality of capacitive proximity sensors in place of left capacitive proximity sensor 240, such as two, three, four, or more capacitive proximity sensors. Likewise, mobile device 200 can include a plurality of capacitive proximity sensors in place of right capacitive proximity sensor 250, such as two, three, four, or more capacitive proximity sensors.

Processor 220 is operable to gain access to the capacitances detected by left capacitive proximity sensor 240 and right capacitive proximity sensor 250 and compare them to expected capacitances for left and right hands. Left capacitive proximity sensor 240 and right capacitive proximity sensor 250 are operable to detect distinct capacitances for air, the palm, thumb, and fingers of a left or right hand, thereby determining the current hold condition.

Ambient light proximity sensor 260 is located on the face of mobile device 200 that would be nearest a user's head when in use and held beside the user's head. Ambient light proximity sensor 260 is configured to detect the proximity of the user's head to mobile device 200. According the amount of ambient light sensed, ambient light proximity sensor 260 is operable to detect when mobile device 200 is beside the user's head.

Accelerometer 270 is coupled to mobile device 200 and is operable to measure acceleration in at least one dimension. In certain embodiments, accelerometer 270 is operable to detect acceleration on two or three axis, corresponding to two-dimensional and three-dimensional acceleration. Accelerometer 270 is operable to detect an orientation of mobile device 200 according to the measured acceleration.

Processor 220 is operable to gain access to an application stored in memory 230 that is configured to gain access to the hold condition, the proximity of the user's head, and the orientation. The program is further configured to use the hold condition, the proximity, and the orientation in combination to determine a handling condition of mobile device 200. In certain embodiments, the application is a software module integrated into an operating system (OS) that is executable on processor 220. For example, in one embodiment, the application is a module integrated into an Android® OS. In another embodiment, the application is a module integrated into iOS® software.

Figure 3:
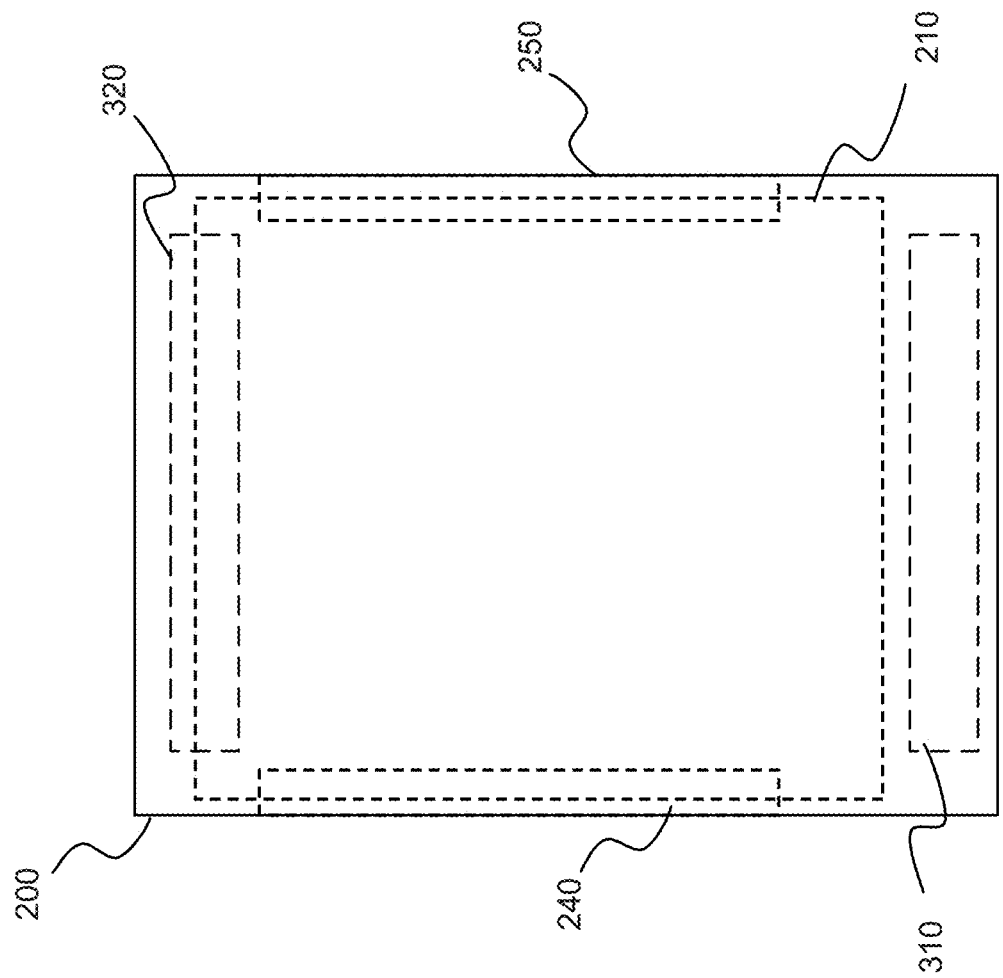
FIG. 3 is a block diagram of one embodiment of a mobile device illustrating antennas.

FIG. 3 is another block diagram of mobile device 200 of FIG. 2. FIG. 3 further illustrates one embodiment of a mobile device having an antenna 310 and an antenna 320. Mobile device 200 also includes display 210, processor 220, left capacitive proximity sensor 240, and right capacitive proximity sensor 250, all of FIG. 2.

Antenna 310 and antenna 320 are configured for use in wireless communication, such as Wi-Fi, Bluetooth, and cellular communication, including third generation (3G), fourth generation (4G), and long term evolution (LTE) standards. Processor 220 is further operable to execute an application configured to use the handling condition to configure or to select which antenna to use for wireless communication. The application can also utilize additional input data to carry out the configuration or selection, such as real time antenna performance measurements or data from other applications. In the illustrated embodiment, antenna 310 and antenna 320 are disposed on the top and bottom of mobile device 200. Antenna 310 and antenna 320 are subject to varying performance according to a given handling condition. For example, antenna 320, at the top, may perform poorly relative to the performance of antenna 310 when mobile device 200 is held in the right hand. In alternative embodiments, antenna 310 and antenna 320 can be shaped and disposed variously in mobile device 200, and can be further accompanied by additional antennas. Accordingly, the selection of either antenna 310 or antenna 320 for use in wireless communication varies per mobile device.

Figure 4:
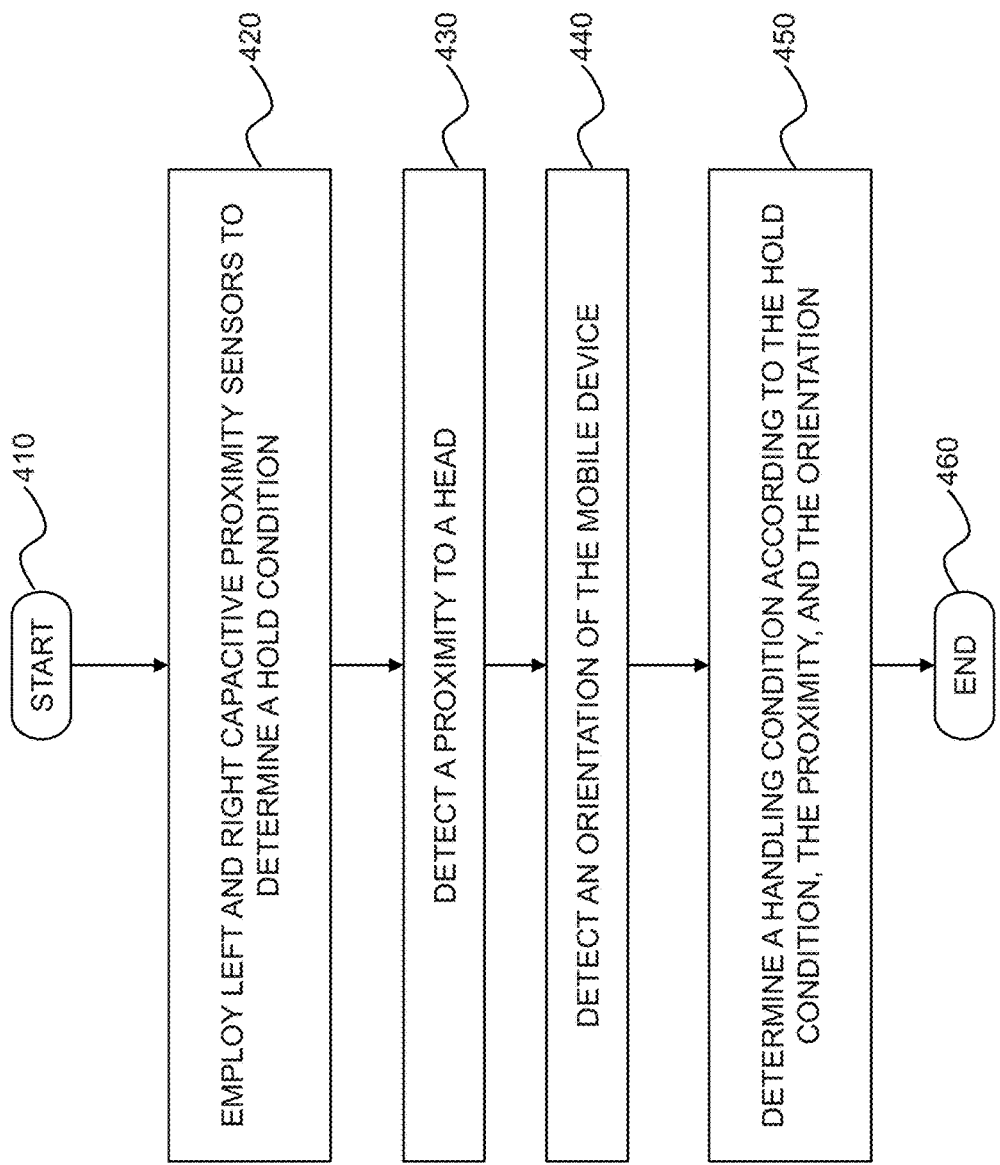
FIG. 4 is a flow diagram of one embodiment of a method of determining a handling condition of a mobile device.

FIG. 4 is a flow diagram of one embodiment of a method of determining a handling condition of a mobile device. The method begins at a start step 410. At a capacitive sensing step 420, left and right capacitive proximity sensors are employed to determine a hold condition of the mobile device. The hold condition includes information describing whether the mobile device is held in a right hand, a left hand, or not held at all. In certain embodiments, the hold condition can also describe that the mobile device is held in both hands. Capacitive proximity sensors are operable to detect a capacitance created by a hand holding the mobile device. The capacitance created by a palm and thumb is distinguishable from that created by fingers. In determining the hold condition, the current capacitances sensed at the left and right capacitive proximity sensors are compared to expected capacitances for the palm and thumb and the fingers. The sensed capacitances are indicative of the hold condition.

At a proximity sensing step 430, a proximity of a user's head to the mobile device is detected. In certain embodiments, proximity sensing step 430 is carried out by an ambient light proximity sensor. When the mobile device is held beside the user's head, the ambient light sensed is less than when not held beside the user's head.

At an orientation sensing step 440, an orientation of the mobile device is determined. The orientation, in combination with the hold condition and proximity to the user's head, is indicative of whether the mobile device is held beside the right side of the user's head, and presumably in the right hand, or held beside the left side of the user's head, and presumably in the left hand. In certain embodiments, orientation is determined according to acceleration measured along at least one directional axis. In alternative embodiments, acceleration is measured along multiple directional axes, for example, two or three axes.

At a combining step 450, the hold condition, the proximity to the user's head and the orientation are employed to determine a handling condition. When the proximity to the user's head indicates the mobile device is held beside the user's head, the hold condition can be used in combination with the orientation to determine in which hand the mobile device is held and on which side of the user's head the mobile device is beside.

In certain embodiments, the method also includes selecting an antenna according to the handling condition determined at combining step 450. The handling condition can impact performance of an antenna on the mobile device. Performance can vary as the mobile device is held in the right hand versus the left hand, and can further vary as the mobile device is held near the user's head. The method then ends at an end step 460.

Figure 5:
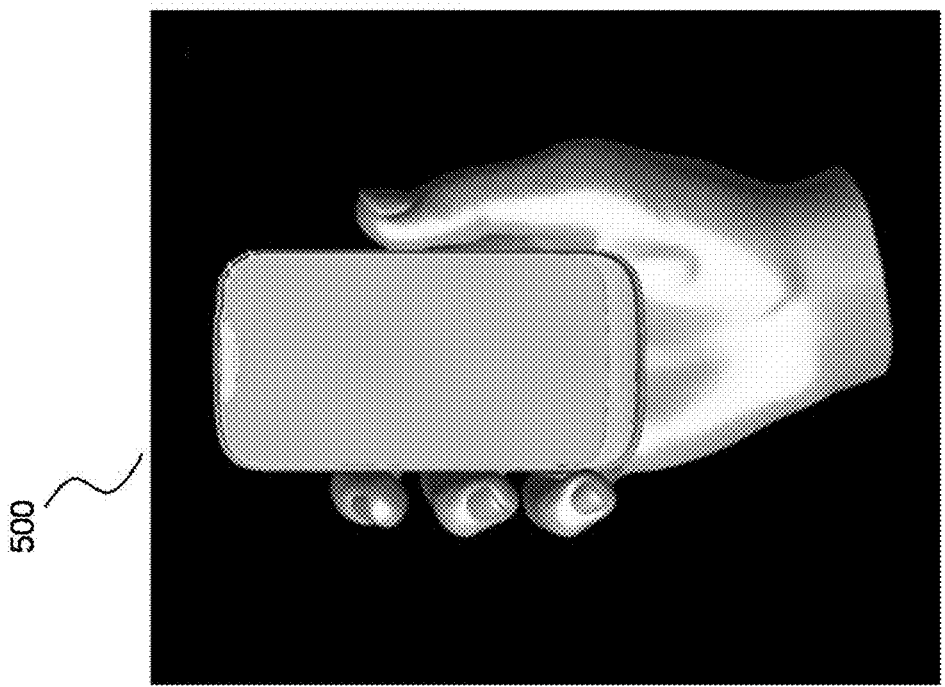
FIG. 5 is an illustrative diagram of a handling condition.

FIG. 5 is an illustrative diagram of a handling condition 500 where one embodiment of a mobile device is held in a user's right hand. As is illustrated in handling condition 500, the thumb of the right hand rests on the right side of the mobile device, opposed to the fingers of the right hand, which rest on the left side. Capacitive proximity sensors disposed on the left and right sides of the mobile device are operable to sense distinct capacitances created by the thumb and fingers. Additionally, a distinct capacitance is present when the mobile device is not held in either hand, otherwise referred to as free space, and another distinct capacitance when the mobile device is held in both hands. According to the respective capacitances present at the left and right capacitive proximity sensors, a determination of the hold condition can be made, which is to determine whether the mobile device is held in the left hand, the right hand, both hands, or no hands.

Figure 6:
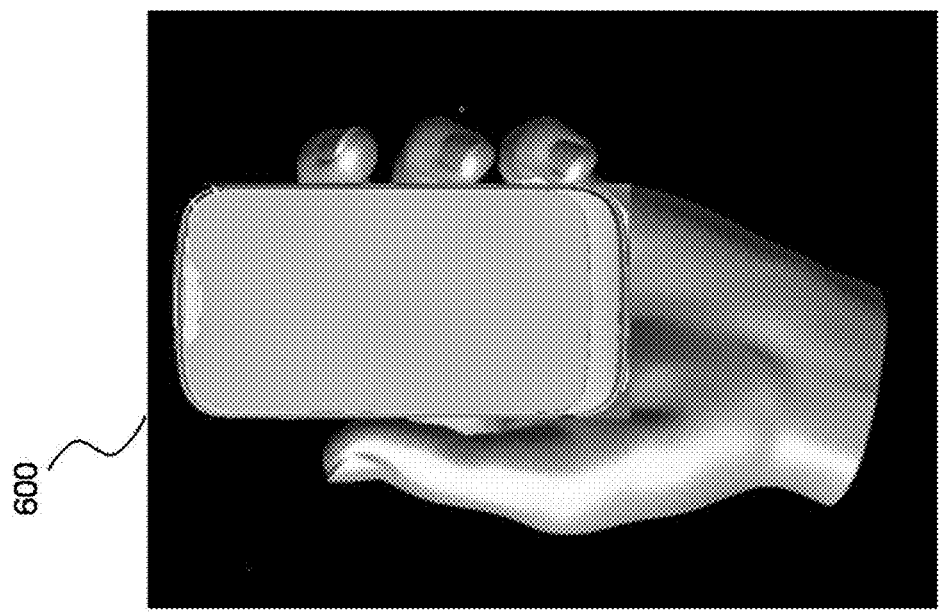
FIG. 6 is an illustrative diagram of another handling condition.

FIG. 6 is an illustrative diagram of a handling condition 600 where one embodiment of a mobile device is held in a user's left hand. As is illustrated in handling condition 600, the thumb of the left hand rests on the left side of the mobile device, opposed to the fingers of the left hand, which rest on the left side. Capacitive proximity sensors disposed on the left and right sides of the mobile device are operable to sense distinct capacitances created by the thumb and fingers. Additionally, a distinct capacitance is present when the mobile device is not held in either hand, otherwise referred to as free space, and another distinct capacitance when the mobile device is held in both hands. According to the respective capacitances present at the left and right capacitive proximity sensors, a determination of the hold condition can be made, which is to determine whether the mobile device is held in the left hand, the right hand, both hands, or no hands.

Figure 7:
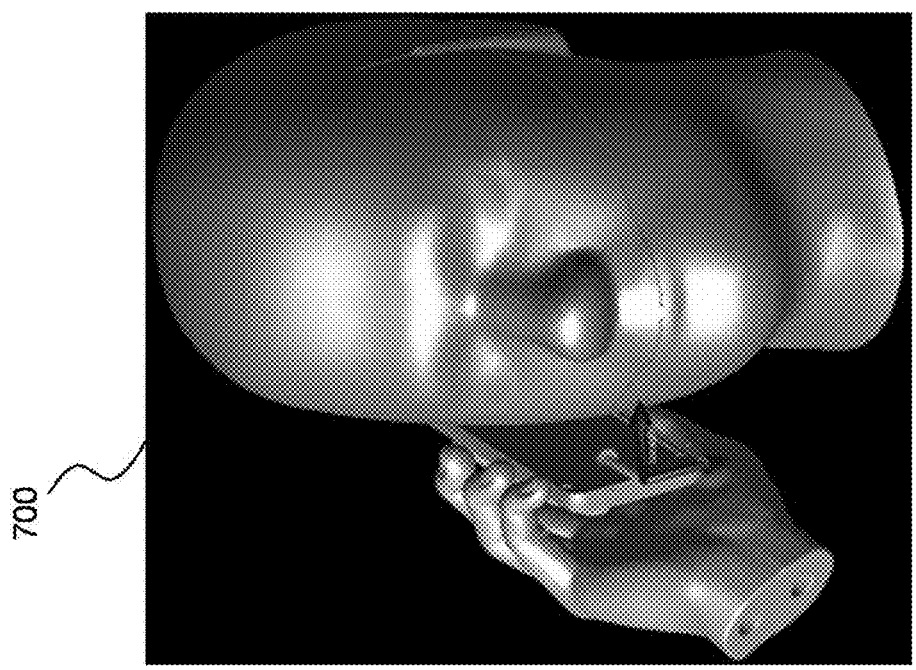
FIG. 7 is an illustrative diagram of another handling condition.

FIG. 7 is an illustrative diagram of a handling condition 700 where one embodiment of a mobile device is held beside a right side of a user's head. When the mobile device is beside the user's head, an ambient light sensor disposed on the face of the mobile device can detect a reduced amount of ambient light, due to the user's head at least partially blocking light to the ambient light sensor. When beside the user's head, the orientation of the mobile device is indicative of which side of the user's head the mobile device is beside. Orientation of the mobile device can be detected by an accelerometer. As is illustrated, when the mobile device is held beside the right side of the user's head, the mobile device experiences a certain amount of clockwise rotation. When detected in combination with a hold condition determined according to capacitive proximity sensors, the rotation can be employed to verify the mobile device is held in the user's right hand.

Figure 8:
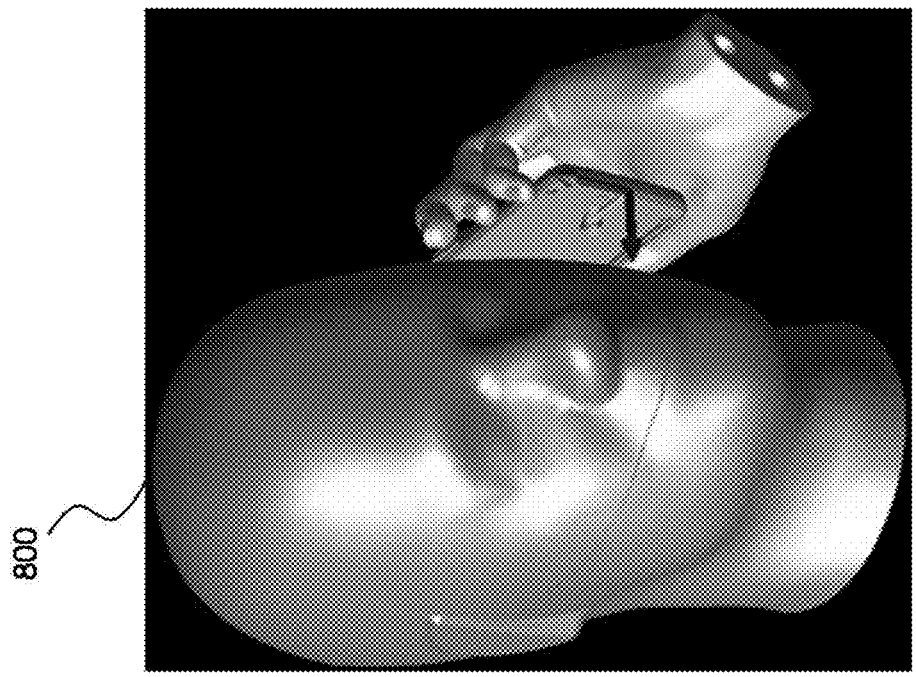
FIG. 8 is an illustrative diagram of another handling condition.

FIG. 8 is an illustrative diagram of a handling condition 800 where one embodiment of a mobile device is held beside a left side of a user's head. When the mobile device is beside the user's head, an ambient light sensor disposed on the face of the mobile device can detect a reduced amount of ambient light, due to the user's head at least partially blocking light to the ambient light sensor. When beside the user's head, the orientation of the mobile device is indicative of which side of the user's head the mobile device is beside. As is illustrated, when the mobile device is held beside the left side of the user's head, the mobile device experiences a certain amount of counter-clockwise rotation. When detected in combination with a hold condition determined according to capacitive proximity sensors, the rotation can be employed to verify the mobile device is held in the user's left hand.

Figure 9:
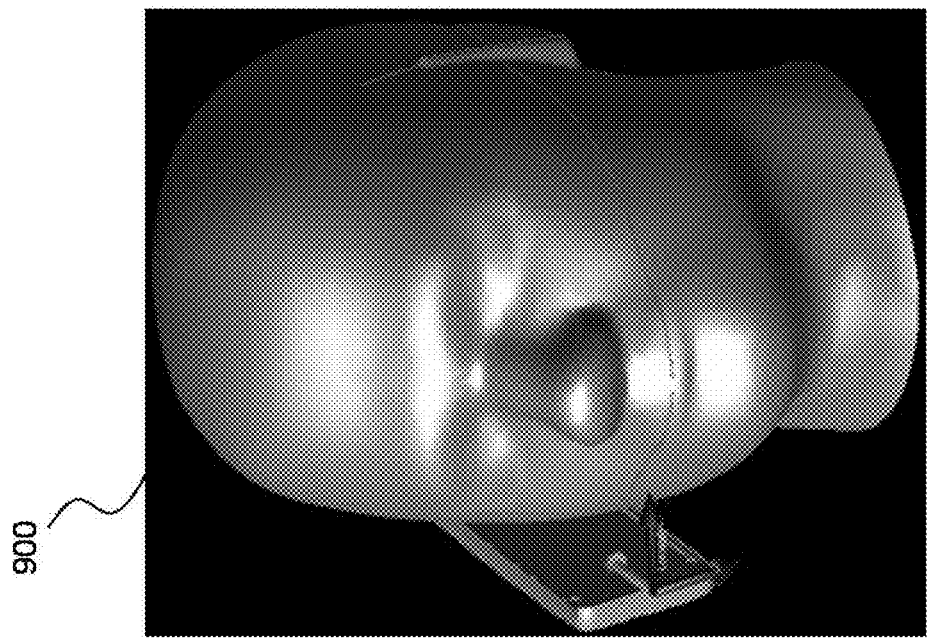
FIG. 9 is an illustrative diagram of another handling condition.

FIG. 9 is an illustrative diagram of a handling condition 900 where one embodiment of a mobile device is beside a right side of a user's head. Similar to handling condition 700 of FIG. 7, the mobile device experiences clockwise rotation when held on the right side of the user's head. However, in handling condition 900, the hold condition determined according to capacitive proximity sensors indicates the mobile device is not held in either hand, otherwise referred to as free space.

Figure 10:
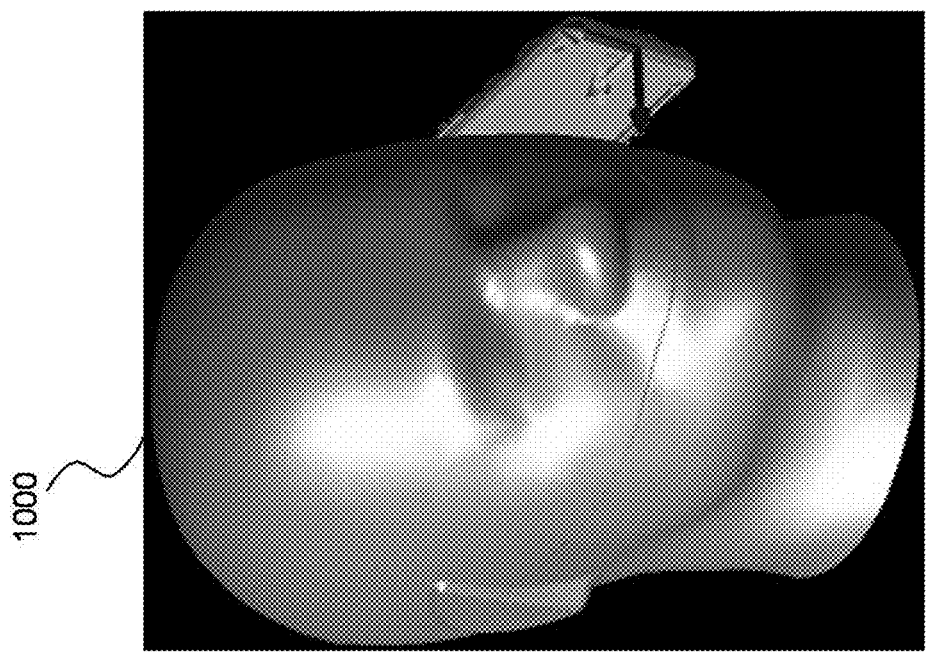
FIG. 10 is an illustrative diagram of yet another handling condition.

FIG. 10 is an illustrative diagram of a handling condition 1000 where one embodiment of a mobile device is beside a left side of a user's head. Similar to handling condition 800 of FIG. 8, the mobile device experiences counter-clockwise rotation when held on the left side of the user's head. However, in handling condition 1000, the hold condition determined according to capacitive proximity sensors indicates the mobile device is not held in either hand, otherwise referred to as free space.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A mobile device comprising:
   an ambient light proximity sensor configured to detect a proximity of an object to a surface of the mobile device;
   a plurality of antennas;
   a processor coupled to the ambient light proximity sensor, and the plurality of antennas, the processor configured to configure, for wireless communication, settings of at least one antenna of the plurality of antennas according to the proximity of the object to the surface of the mobile device as detected by the ambient light proximity sensor; and
   a transmitter configured to transmit a wireless signal over the at least one antenna.

2. The mobile device of claim 1, wherein the ambient light proximity sensor is configured to detect a proximity of a user to the surface of the mobile device.

3. The mobile device of claim 2, wherein the proximity of the user to the surface of the mobile device is a basis for configuring the settings of the at least one antenna.

4. The mobile device of claim 2, wherein the ambient light proximity sensor is configured to detect whether the mobile device is within a threshold distance of the user.

5. The mobile device of claim 1, wherein the processor is further configured to configure the settings of the at least one antenna at least by selecting the at least one antenna for wireless communication according to the proximity of the object to the surface of the mobile device as detected by the ambient light proximity sensor.

6. A mobile device comprising:
   a first capacitive proximity sensor;
   a second capacitive proximity sensor positioned on an opposite side of the mobile device from the first capacitive proximity sensor, the first capacitive proximity sensor and the second capacitive proximity sensor each configured to detect a relative proximity of a user to a respective side of the mobile device;
   a plurality of antennas; and
   a processor coupled to the first capacitive proximity sensor and the second capacitive proximity sensor the processor configured to determine a handling or hold condition of the mobile device based on the relative proximity of the user to the respective sides of the mobile device as detected by the first capacitive proximity sensor and the second capacitive proximity sensor, and to configure, for wireless communication, settings of at least one antenna of the plurality of antennas according to the handling or hold condition of the mobile device; and
   a transmitter configured to transmit a wireless signal over the at least one antenna.

7. The mobile device of claim 6, wherein the handling or hold condition of the mobile device indicates that the mobile device is being held by a right hand of the user or a left hand of the user.

8. The mobile device of claim 6, wherein the handling or hold condition of the mobile device indicates that the mobile device is being held by both hands of the user.

9. The mobile device of claim 6, wherein the handling or hold condition of the mobile device indicates that the mobile device is being held in free space.

10. The mobile device of claim 6, wherein the handling or hold condition of the mobile device indicates whether the mobile device is being held within a threshold distance from the user.

11. The mobile device of claim 6, wherein the handling or hold condition of the mobile device indicates whether the mobile device is being held on a right side or a left side of a user's head.

12. The mobile device of claim 6, wherein the processor is further configured to configure the settings of the at least one antenna at least by selecting the at least one antenna for wireless communication according to the handling or hold condition of the mobile device.

13. A mobile device comprising:
a plurality of antennas;
an ambient light proximity sensor configured to detect a proximity of an object to a surface of the mobile device;
a processor coupled to the ambient light proximity sensor, wherein the processor is configured to determine a handling or hold condition of the mobile device based on the proximity of the object to the surface of the mobile device as detected by the ambient light proximity sensor, and to configure, for wireless communication, settings of at least one antenna of the plurality of antennas according to the handling or hold condition of the mobile device; and
a transmitter configured to transmit a wireless signal over the at least one antenna.

14. The mobile device of claim 13, wherein the handling or hold condition of the mobile device indicates that the mobile device is being held by a right hand of a user or a left hand of the user.

15. The mobile device of claim 13, wherein the handling or hold condition of the mobile device indicates that the mobile device is being held by both hands of a user.

16. The mobile device of claim 13, wherein the handling or hold condition of the mobile device indicates that the mobile device is being held in free space.

17. The mobile device of claim 13, wherein the handling or hold condition of the mobile device indicates whether the mobile device is being held within a threshold distance from a user.

18. The mobile device of claim 13, wherein the handling or hold condition of the mobile device indicates whether the mobile device is being held on a right side or a left side of a user's head.

19. The mobile device of claim 13, wherein the processor is further configured to configure the settings of the at least one antenna at least by selecting the at least one antenna for wireless communication according to the handling or hold condition of the mobile device.

* * * * *